(12) United States Patent
Cowley et al.

(10) Patent No.: US 7,907,008 B2
(45) Date of Patent: Mar. 15, 2011

(54) DYNAMIC SIGNAL CONTAMINATION SUPPRESSION

(75) Inventors: Nicholas P. Cowley, Wroughton (GB); Richard J. Goldman, Cirencester (GB); David A. Sawyer, Wiltshire (GB); Nader Rohani, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 12/346,523

(22) Filed: Dec. 30, 2008

(65) Prior Publication Data

US 2010/0164617 A1    Jul. 1, 2010

(51) Int. Cl.
*H03F 1/36* (2006.01)

(52) U.S. Cl. ........................................................ 330/86

(58) Field of Classification Search .................... 330/86, 330/133, 149

See application file for complete search history.

(56) References Cited

U.S. PATENT DOCUMENTS

| | | | |
|---|---|---|---|
| 5,208,550 A * | 5/1993 | Iwane | 330/129 |
| 5,444,417 A | 8/1995 | Botti et al. | |
| 5,589,796 A * | 12/1996 | Alberth et al. | 330/133 |
| 5,654,668 A | 8/1997 | Botti et al. | |
| 6,288,609 B1 | 9/2001 | Brueske et al. | |
| 6,611,168 B1 | 8/2003 | Denison et al. | |
| 6,801,089 B2 | 10/2004 | Costa et al. | |
| 2008/0153447 A1 | 6/2008 | Cowley et al. | |

FOREIGN PATENT DOCUMENTS

| | | |
|---|---|---|
| EP | 1249931 A2 | 10/2002 |
| EP | 1548933 A1 | 6/2005 |

OTHER PUBLICATIONS

Search Report in Related Application PCT/US2009/069135 mailed Jul. 29, 2010.

* cited by examiner

*Primary Examiner* — Robert Pascal
*Assistant Examiner* — Khiem D Nguyen
(74) *Attorney, Agent, or Firm* — Pillsbury Winthrop Shaw Pittman LLP

(57) ABSTRACT

A self-configurable amplifier and method of amplification, including an RF signal level detector having an input connected to an RF signal, and an output configured to produce a control signal responsive to a power level of the RF signal. The control signal is supplied to a parametric adjustment circuit that includes an input connected to the control signal, and an output configured to provide a negative feedback responsive to the control signal. The negative feedback is supplied to an RF amplifier that includes an input forming an input of the self-configurable amplifier, an output forming an output of the self-configurable amplifier, and a control port connected to the output of the parametric adjustment circuit, such that one or more parameters of the RF amplifier is responsive to the negative feedback.

28 Claims, 3 Drawing Sheets

DYNAMIC SIGNAL CONTAMINATION SUPPRESSION

RELATED APPLICATION

None.

FIELD OF INVENTION

Embodiments of the invention relate to apparatus and method for self-adjusting dynamic amplification.

BACKGROUND

Embodiments of the invention relate to apparatus and method for self-adjusting amplification in response to received signal conditions.

DETAILED DESCRIPTION

Figure 1:
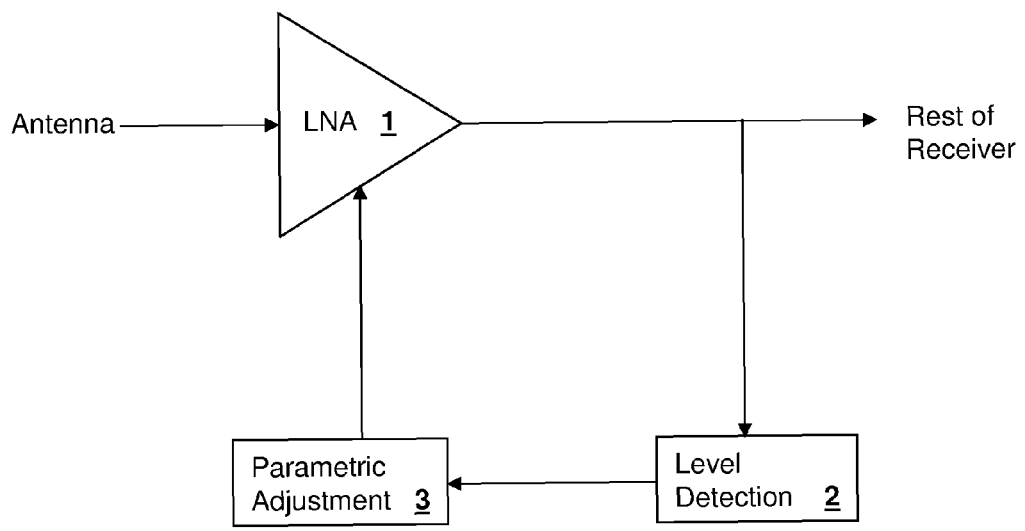
FIG. 1 shows a feedback embodiment of the invention.

In the following description, numerous specific details are set forth. However, embodiments of the invention may be practiced without these specific details. In other instances, well-known circuits, structures and techniques have not been shown in detail in order not to obscure the understanding of this description. Reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

Conventional receivers of wireless radio frequency (RF) signals include an amplifier toward the beginning of the receiver equipment chain. Other elements of the receiver chain typically include a filter and a mixer to shift the frequency. At least portions of these functions may be implemented in a software-defined receiver. A figure of merit of a receiver is the carrier to noise ratio (C/N), i.e., the ratio of power in a carrier to the power of noise within a noise bandwidth, wherein the carrier refers to the desired communication signal. A higher C/N is generally preferred, indicating a higher proportion of information-bearing carrier energy, compared to the non-information-bearing noise energy.

The amplifier is typically designed as a low noise amplifier (LNA) in order to mitigate the effects later in the circuit of noise introduced toward the beginning of the circuit. The LNA may be exposed to unwanted RF energy, for instance interfering signals and/or noise. The LNA should be able to cope with a range of such interfering signals without causing excessive degradation to the desired RF signal.

Noise figure (NF) is a measure of degradation of the C/N caused by components in the RF signal chain. The noise figure is the ratio of the output noise power of a device to the portion thereof attributable to thermal noise in the input termination at standard noise temperature $T_0$ (usually 290° K). The noise figure is thus the ratio of actual output noise to that which would remain if the device itself did not introduce noise.

Intermodulation is the result of two or more signals of different frequencies being mixed together, forming additional spurious signals at frequencies that are at sums and/or differences of the frequencies of the signals. Intermodulation may be caused by non-linear behavior of elements in the receive chain. Intermodulation is undesirable because it creates spurious emissions that interfere with the desired signal or with one or more desired signals at one or more adjacent freqencies.

The power of the spurious signals depends upon the power of the signals mixing together, and the spurious signal power increases at a faster rate than the rate of increase of the signals being mixed. A figure of merit for the non-linear behavior of elements in the receive chain is the intercept point (IP), which is where an asymptotic rate of increase the power of an intermodulation product intersects the asymptotic rate of increase of the power of the signals being mixed. Generally, a higher IP is preferred because it produces more linear behavior of the elements in the receive chain. A separate IP exists for each intermodulation product, e.g., IP3 is the intercept point for the third-order intermodulation product.

It is well known by persons of ordinary skill in the art of RF receiver design that the requirements of a low noise figure and a high intercept point are difficult to achieve simultaneously. Existing technologies typically include a fixed dynamic range for active circuits. This produces acceptable performance for noise figure and/or intermodulation intercept over a limited range of input conditions. Circuit design which tends to lower the noise figure will also tend to reduce the intercept point, and conversely, a high noise figure also tends to raise the intercept point. Specifically, conventional design is that a high intermodulation intercept can be achieved by providing high negative feedback such as by degeneration resistance; this however will lead to an increase in noise figure and a limitation to the gain that can be achieved; whereas low negative feedback degeneration resistance will deliver a lower noise figure but also a lower intermodulation intercept performance.

An objective of the present invention is to enable an amplifier (e.g., an LNA) to produce a low noise figure when operating in weak input signal conditions, and to have a high signal handling capability when operating in strong input signal conditions. Embodiments of the invention include an active circuit which is reactive to the received signal conditions and self optimizes dynamic range performance based on received signal conditions. For instance, the gain characteristics of an amplifier are dynamically adjusted in response to the input signal conditions, e.g., a strong signal or a weak signal.

Embodiments of the invention provide a self-configurable amplifier and method of amplification, including an RF signal level detector having an input connected to an RF signal, and an output configured to produce a control signal responsive to a power level of the RF signal. The control signal is supplied to a parametric adjustment circuit that includes an input connected to the control signal, and an output configured to provide a negative feedback responsive to the control signal. The negative feedback is supplied to an RF amplifier that includes an input forming an input of the self-configurable amplifier, an output forming an output of the self-configurable amplifier, and a control port connected to the output of the parametric adjustment circuit, such that one or more parameters of the RF amplifier is responsive to the negative feedback.

A circuit including this invention will deliver an improved user experience in terms of delivered C/N, compared to existing technologies. Specifically, when operating in a weak signal environment, embodiments of the present invention will have a lower NF than the prior art, thereby improving the reception of weaker signals. Conversely, when strong signals are present, the circuit will configure itself for a high intercept performance, thereby enhancing the linearity of the circuit. The more linearized circuit will be more resistant to intermodulation products formed from the strong signals, thereby improving the reception of stronger signals. The circuit may be used in an LNA, however the circuit is not limited in this respect and may be used in other functional blocks (e.g., other amplifiers) within the signal path.

Embodiments of the invention usable in an LNA include a detector circuit to detect the average or peak power of the composite incident signal, a circuit configured to vary the noise figure and/or signal handling of an amplifier stage, and a control circuit to control the noise figure and/or signal handling in response to the detected signal amplitude in a predictive manner.

Embodiments of the invention may be used in digital television receivers. Desirable characteristics of such receivers include the ability to provide high sensitivity and hence low NF in weak signal conditions, and high selectivity and hence high intermodulation intercept performance in strong signal conditions or in the presence of strong undesired, blocking signals.

In a first embodiment, a circuit includes an amplifier of a composite incident signal, a means for detecting the average or peak power of the composite incident signal, a means for varying parameters of the amplifier (e.g., Noise Figure, second- and third-order intercept points, 1-dB compression point, amplifier clipping level, etc.), and a means for controlling the parameters in response to the detected signal amplitude in a predictive manner.

Existing technologies (e.g., standard configurations for common base or emitter amplifiers, with or without feedback linearization applied) are known to use significant DC power by the amplifier in order to achieve simultaneously a preferred performance level of noise figure and intermodulation intercept. Embodiments of the invention enable a circuit to be implemented which delivers an improved operating dynamic range over which predetermined performance criteria are satisfied, compared to competing technologies, while doing so at a lower DC power consumption.

A shortfall of the prior art is that increasing the negative feedback would also degrade the noise figure. In one embodiment of the invention, circuit performance is dynamically adjusted in response to detected RF power, for example through increased negative feedback, thereby allowing handling of high input RF signal power levels. The detector, designed to detect the mean or the peak of the RF power level, may be of a standard type that is well known to persons of ordinary skill in the art of receiver design.

Adjustment of the negative feedback depends on the desired type of feedback. One such feedback would be by providing a feedback current. The magnitude of this feedback current could be varied by a simple, well-known steering arrangement whereby some current is used for feedback and some not. By varying the steering the amount of feedback is varied The feedback is such that more negative feedback produces greater linearity in the amplifier.

In another embodiment, circuit performance is dynamically adjusted by providing a higher standing current in the amplifier, i.e., the DC current that is applied to achieve a predetermined level of performance. A higher standing current allows handling of high input RF signal power levels, because a larger voltage swing can be applied into a given load before the amplifier is starved of current. The higher current is provided when needed for high input RF power levels, and the current may be reduced when the input RF signal power is not at high levels. However the average current in this embodiment still will be lower than the current in existing technologies, because the current will vary over time with operating signal conditions. Generally, a lower amplifier current is known to produce less shot noise, thereby reducing the effect of the amplifier as a noise source.

FIG. 1 shows a block diagram of an embodiment of the invention, employing negative feedback, wherein an RF signal, typically from an antenna, is provided as an input to LNA 1. LNA 1 may be a common-emitter amplifier, either in a differential or single ended configuration, but other amplifier configurations may be used and are well known to persons of ordinary skill in the art of receiver design. The output of the LNA 1 is provided to a level detection 2. Level detection 2 provides inputs to a parametric adjustment 3. The parametric adjustment 3 may adjust one or more of the noise figure (NF), second- or third-order intercept points (IP2, IP3), 1-dB compression point, or any combination of these parameters.

Figure 2:
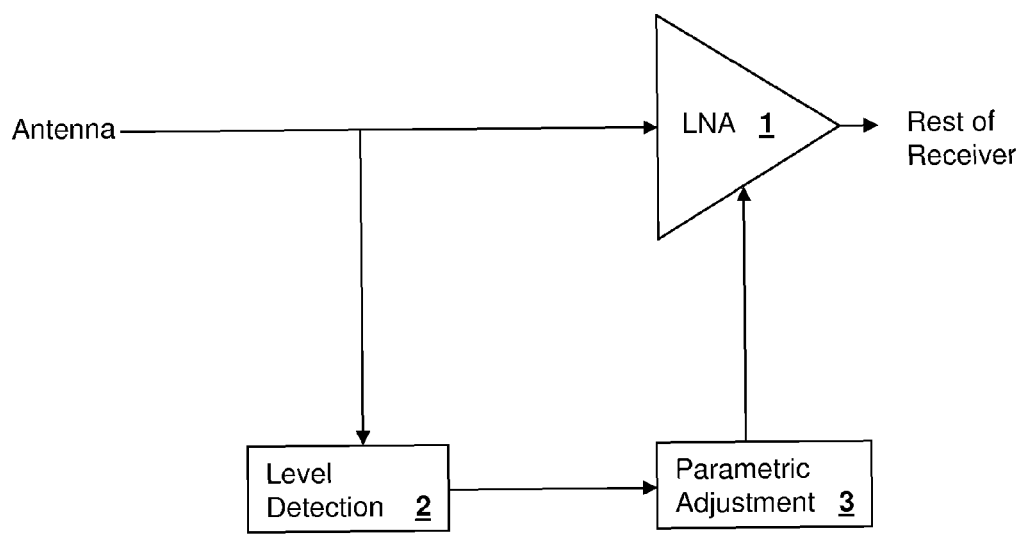
FIG. 2 shows a feedforward embodiment of the invention.

FIG. 2 shows a block diagram of an embodiment of the invention, but employing a negative feed-forward signal level detection rather than negative feedback. An RF signal, typically from an antenna, is provided as an input to LNA 1 and also to the input of a level detection 2. Level detection 2 provides inputs to a parametric adjustment 3. Parametric adjustment 3 adjusts the operating point of LNA 1 in order to decrease the noise figure of LNA 1, or to increase the intercept point of LNA 1. In other respects the embodiment of FIG. 2 operates similarly to the embodiment of FIG. 1.

Figure 3:
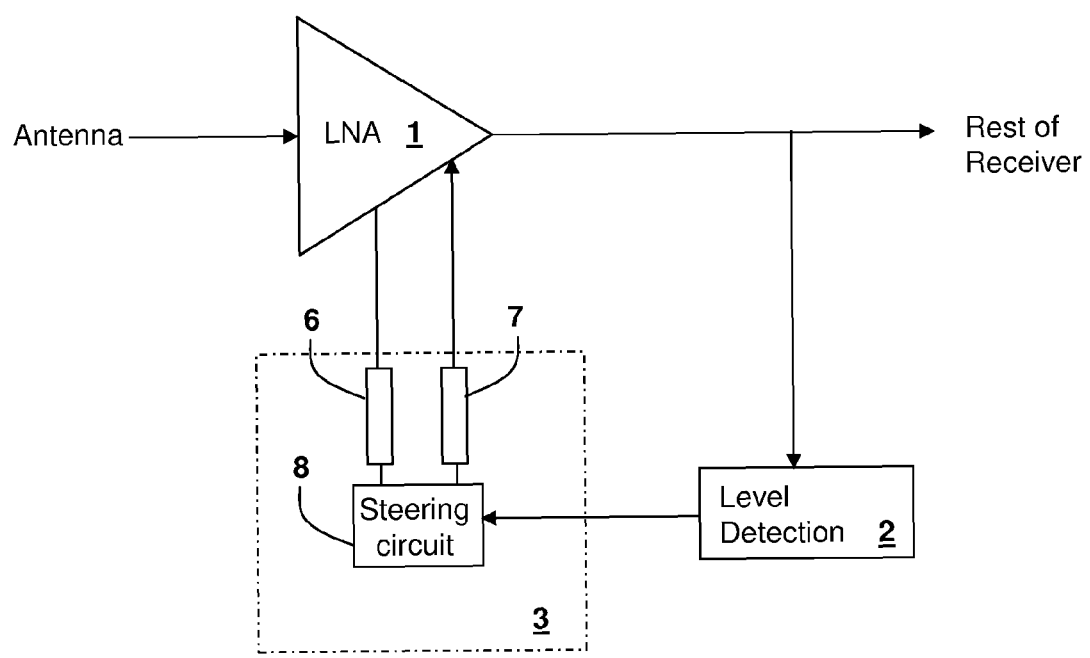
FIG. 3 shows an embodiment of a parametric adjustment.

The negative feedback provided by parametric adjustment 3 may be implemented in several ways. For instance, referring to FIG. 3, in one embodiment the negative feedback may be implemented by a resistive feedback from the output of the amplifier to the input of the amplifier. A feedforward embodiment (not shown) may also be used. The parametric adjustment 3 may be formed by using a steering circuit 8 to independently steer current among at least two independent resistive feedback networks, producing a first feedback set by the first resistive feedback network 6, and a second feedback set by the second resistive feedback network 7. The ratio of the currents steered through the multiple resistive feedback networks is adjusted, thereby providing an adjustable negative feedback formed from combinations of, e.g., the first feedback 6 and the second feedback 7. The negative feedback provided by parametric adjustment 3 adjusts the operating point of LNA 1 in order to decrease the noise figure of LNA 1, or to increase the intercept point As the amount of negative feedback increases, the signal handling capability of LNA 1 would increase, but the noise figure of LNA 1 would degrade. The output of LNA 1 is then provided to downstream elements in the rest of the RF receiver.

Figure 4:
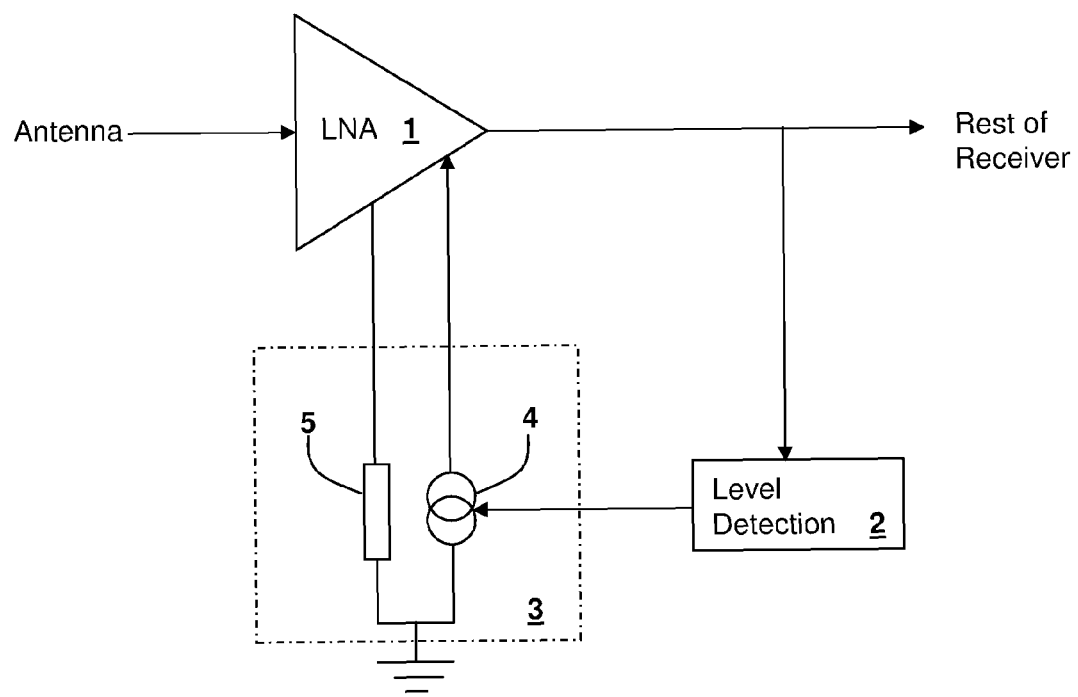
FIG. 4 shows an alternate embodiment of a parametric adjustment.

FIG. 4 shows a block diagram of an embodiment of the invention, employing negative feedback, wherein the parametric adjustment 3 has been depicted as a parallel combination of an adjustable DC current source 4 and resistor 5. Resistor 5 provides a linear resistance $R_e$ that is discussed in more detail below. In this embodiment, a standing current provided at least by the adjustable DC current source 4 is varied in response to level detection 2, whereby under low received signal conditions, a low standing current is applied in order to minimize transistor shot noise, the shot noise being proportional to the standing current. In addition, the negative feedback may be small, thereby minimizing contribution of the negative feedback to the additive noise and noise figure of LNA 1. This can be achieved since under the condition of small negative feedback, the intermodulation intercept is proportional to degenerative feedback. The proportionality arises because the linearity is set by the ratio of voltage drop across LNA 1, which is nonlinear, and the linear external device. The nonlinear resistance of the device is inversely proportional to the current in the device, so increasing the current will increase linearity.

Although FIG. 4 shows negative feedback, in an alternative embodiment there may be employed negative feedforward, in which the received signal prior to amplification is processed and supplied to the LNA.

Under high received signal conditions a high standing current is applied, causing an increase to the ratio of the degenerative feedback to $r_e$, where $r_e$ is defined as the inverse of the transmittance of the amplifier (i.e., $r_e = 1/g_m$). As a result of increasing this ratio, the intermodulation intercept and signal handling capability of the amplifier can be increased. This is because the linearity of a transmittance amplifier (i.e., a voltage-to-current converter) is proportional to a ratio of degeneration resistance, i.e., the ratio of a fixed resistance on the emitter terminal to the inverse of the amplifier transmittance (i.e., $r_e$). This is a fundamental characteristic related to the threshold voltage $V_t$. The relation is such that a greater standing current, set by, e.g., adjustable DC current source 4 and resistor 5, causes a greater transconductance ($g_m$) and thereby lowers the $r_e$. A lower $r_e$ causes the ratio $R_e/r_e$ to increase, wherein $R_e$ is the resistance provided by resistor 5, thereby improving the signal handling for large signals. This is because $r_e$ is a non linear resistance whereas $R_e$ is a linear resistance from resistor 5, so if $r_e$ is reduced then the linearity increases.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A self-configurable amplifier, comprising:
   an RF signal level detector comprising an input connector to an RF signal, and an output configured to produce a control signal responsive to a power level of the RF signal;
   a parametric adjustment circuit comprising an input connected to the control signal, and an output configured to provide a negative feedback responsive to the control signal; and
   an RF amplifier comprising an input forming an input of the self-configurable amplifier, and output forming an output of the self-configurable amplifier, and a control port connected to the output of the parametric adjustment circuit, wherein one or more parameters of the RF amplifier is responsive to the negative feedback and is configured to optimize a dynamic range performance of the self-configurable amplifier, wherein a noise figure of the RF amplifier is responsive to the negative feedback.

2. The self-configurable amplifier of claim 1, wherein the input of the RF signal level detector is connected to the input of the self-configurable amplifier.

3. The self-configurable amplifier of claim 1, wherein the input of the RF signal level detector is connected to the output of the self-configurable amplifier.

4. The self-configurable amplifier of claim 1, wherein an intercept point of the RF amplifier is responsive to the negative feedback.

5. The self-configured amplifier of claim 4, wherein the intercept point includes a point where an asymptotic rate of increase of a power of an intermodulation product of a composite RF signal intersects an asymptotic rate of increase of a power of a first RF signal and a second RF of the composite RF signal.

6. The self-configurable amplifier of claim 1, wherein the one or more parameters of the RF amplifier is selected from the group consisting of a 1-db compression point, and a clipping level.

7. The self-configurable amplifier of claim 1, wherein a greater power level of the RF signal produces increased negative feedback to the RF amplifier.

8. The self-configurable amplifier of claim 1, wherein the parametric adjustment circuit further comprises a first resistive feedback, a second resistive feedback different than the first resistive feedback and parallel to the first resistive feedback, and a circuit to provide an adjustable coupling from the control signal to the first resistive feedback and from the control signal to the second resistive feedback.

9. The self-configurable amplifier of claim 1, wherein the parametric adjustment circuit further comprises a fixed resistance and an adjustment current source in parallel with the fixed resistance, the adjustable current source responsive to the control signal.

10. The self-configurable amplifier of claim 1, Wherein the parametric adjustment circuit is configured to provide a higher standing current in response to a higher power level of the RF signal.

11. The self-configurable amplifier of claim 1, wherein the RF signal is a composite RF signal.

12. The self-configurable amplifier of claim 11, wherein the RF signal level detector is configured to detect average or peak power of the composite RF signal.

13. The self-configured amplifier of claim 1, wherein the noise figure includes a measure of degradation of a carrier-to-noise ratio caused by components in the amplifier.

14. The self-configured amplifier of claim 1, wherein the RF amplifier includes a low noise amplifier.

15. The self-configured amplifier of claim 1, wherein the one or more parameters are configured to produce a low noise figure when the RF signal is at a first power level and to produce a high signal handling capability when the RF signal is at a second power level, wherein the first power level is lower than the second power level.

16. A method of self-configuring a self-configurable amplifier, comprising:
   detecting an RF signal level by use of an RF Signal level detector, the detector comprising: an input connected to an RF signal, and an output configured to produce a control signal responsive to a power level of the RF signal;
   parametrically adjusting a negative feedback signal, responsive to the control signal, by use of a parametrical adjustment circuit, the adjustment circuit comprising an input connected to the control signal, and an output configured to provide the negative feedback signal; and
   controllably amplifying an RF signal by use of the negative feedback signal supplied to an amplifier, wherein: one or more parameters of the RF amplifier is responsive to the negative feedback; an input of the amplifier forms an input of the self-configurable amplifier; and an output of the amplifier forms an output of the self-configurable amplifier, wherein the one or more parameters are configured to optimize a dynamic range performance of the self-configurable amplifier, wherein controllably amplifying an RF signal comprises adjusting a noise figure of the RF amplifier responsively to the negative feedback.

17. The method of claim 16, wherein detecting an RF signal level comprises detecting an RF signal level at the input of the self-configurable amplifier.

18. The method of claim 16, wherein detecting an RF signal level comprises detecting RF signal level at the output of the self-configurable amplifier.

19. The method of claim 16, wherein controllably amplifying an RF signal comprises adjusting an intercept point of the RF amplifier responsively to the negative feedback.

20. The method of claim 19, wherein the intercept point includes a point where an asymptotic rate of increase of a power of an intermodulation product of a composite RF signal intersects an asymptotic rate of increase of a power of a first RF signal and a second RF of the composite RF signal.

21. The method of claim 16, herein controllably amplifying an RF signal comprises adjusting, responsively to the negative feedback, a parameter selected from the group consisting of a 1-db compression point, and a clipping level.

22. The method of claim 16, wherein parametrically adjusting a negative feedback signal comprises producing increased negative feedback to the RF amplifier in response to a greater power level of the RF signal.

23. The method of claim 16, wherein parametrically adjusting a negative feedback signal comprises: providing a first resistive feedback; providing a second resistive feedback different than the first resistive feedback and parallel to the first resistive feedback; and adjustably coupling the control signal to the first resistive feedback and from the control signal to the second resistive feedback.

24. The method of claim 16, wherein parametrically adjusting a negative feedback signal comprises: providing a fixed resistance; and adjusting an adjustable current source in parallel with the fixed resistance, the adjustable current source responsive to the control signal.

25. The method of claim 16, wherein parametrically adjusting a negative feedback signal comprises providing a higher standing current in response to a higher power level of the RF signal.

26. The method of claim 16, wherein the RF signal is a composite RF signal.

27. The method of claim 26, wherein the RF signal level detector is configured to detect average or peak power of the composite RF signal.

28. The method of claim 11, wherein the noise figure includes a measure of degradation of a carrier-to-noise ratio caused by components in the amplifier.

* * * * *